United States Patent
Yamauchi

[11] Patent Number: 6,041,430
[45] Date of Patent: Mar. 21, 2000

[54] ERROR DETECTION AND CORRECTION CODE FOR DATA AND CHECK CODE FIELDS

[75] Inventor: Alan M. Yamauchi, Saratoga, Calif.

[73] Assignee: Sun Microsystems, Inc., Palo Alto, Calif.

[21] Appl. No.: 08/963,501

[22] Filed: Nov. 3, 1997

[51] Int. Cl.[7] ............................................. H03M 13/00
[52] U.S. Cl. ................................................. 714/752
[58] Field of Search ................................. 714/752, 746, 714/753, 780, 785, 793, 807, 808, 755, 757, 758, 761, 781, 782, 783, 825, 797

[56] References Cited

U.S. PATENT DOCUMENTS

| | | | |
|---|---|---|---|
| 4,531,213 | 7/1985 | Scheuneman | 714/758 |
| 4,586,183 | 4/1986 | Wilkinson | 714/758 |
| 4,888,774 | 12/1989 | Kosuge et al. | 714/758 |
| 4,951,284 | 8/1990 | Abdel Ghaffar et al. | 714/758 |
| 5,051,999 | 9/1991 | Erhart et al. | 714/785 |
| 5,440,570 | 8/1995 | Wei et al. | 714/756 |
| 5,459,740 | 10/1995 | Glaise | 714/759 |
| 5,491,702 | 2/1996 | Kinsel | 714/758 |
| 5,588,010 | 12/1996 | Hardell, Jr. et al. | 714/752 |
| 5,600,659 | 2/1997 | Chen | 714/761 |
| 5,627,843 | 5/1997 | Deng et al. | 714/752 |
| 5,666,371 | 9/1997 | Purdham | 714/752 |
| 5,771,248 | 6/1998 | Katayama et al. | 714/752 |
| 5,856,987 | 1/1999 | Holmann | 714/752 |

OTHER PUBLICATIONS

S. Lei; The Syndrome Distribution of m–bit Error Patterns and the Analysis of ATM Forward Error Correction Codes; IEEE Transaction on Communications; vol. 43 2–4 3, 1995.

Hsiao, M.Y., A Class Of Optimal Minimum Odd–Weight–Column SEC–DED Codes, IBM J. Res. Develop. pp. 395–401 (Jul. 1970).

*Primary Examiner*—Albert De Cady
*Assistant Examiner*—Jason Greene
*Attorney, Agent, or Firm*—Townsend and Townsend and Crew LLP

[57] ABSTRACT

A method and apparatus for detecting and correcting single bit errors, detecting double bit errors, and detecting multiple bit errors within a nibble of a data field comprising 135 data bits and 9 check bits. 9 check bits are generated based on 135 data bits. The 9 check bits are appended to the data bits and the cumulative data field is checked for errors. An error detection syndrome is generated that indicates whether an error has occurred and whether the error is correctable. Check bit generation and error detection syndrome generation is accomplished based on the ordering in an ECC code matrix.

20 Claims, 8 Drawing Sheets

SEC-DED-S4ED ECC MATRIX DATA BITS 91:M0 (300)

| | D91 | D90 | D89 | D88 | D87 | D86 | D85 | D84 | D83 | D82 | D81 | D80 | D79 | D78 | D77 | D76 | D75 | D74 | D73 | D72 | D71 | D70 | D69 | D68 | D67 | D66 | D65 | D64 | M3 | M2 | M1 | M0 |
|---|---|---|---|---|---|---|---|---|---|---|---|---|---|---|---|---|---|---|---|---|---|---|---|---|---|---|---|---|---|---|---|---|
| S0 | 0 | 0 | 0 | 0 | 0 | 0 | 0 | 0 | 0 | 0 | 0 | 0 | 0 | 0 | 0 | 0 | 0 | 1 | 0 | 0 | 1 | 1 | 0 | 0 | 1 | 0 | 0 | 0 | 0 | 0 | 1 | 0 |
| S1 | 0 | 0 | 0 | 1 | 0 | 0 | 0 | 0 | 0 | 1 | 0 | 0 | 0 | 0 | 0 | 0 | 0 | 0 | 1 | 1 | 0 | 0 | 1 | 0 | 0 | 0 | 0 | 0 | 0 | 1 | 0 | 0 |
| S2 | 1 | 0 | 1 | 0 | 0 | 0 | 1 | 0 | 0 | 0 | 0 | 1 | 0 | 0 | 0 | 1 | 0 | 1 | 0 | 0 | 0 | 0 | 1 | 0 | 0 | 1 | 0 | 1 | 0 | 1 | 0 | 0 |
| S3 | 0 | 1 | 0 | 0 | 1 | 0 | 0 | 0 | 1 | 0 | 0 | 0 | 0 | 1 | 0 | 0 | 1 | 0 | 0 | 1 | 0 | 0 | 1 | 0 | 1 | 0 | 0 | 0 | 1 | 0 | 0 | 0 |
| S4 | 0 | 0 | 0 | 0 | 0 | 1 | 0 | 0 | 0 | 0 | 1 | 0 | 1 | 0 | 0 | 0 | 0 | 0 | 1 | 0 | 1 | 0 | 1 | 0 | 1 | 0 | 1 | 1 | 1 | 1 | 1 | 1 |
| S5 | 0 | 0 | 0 | 0 | 0 | 0 | 0 | 0 | 1 | 0 | 0 | 1 | 0 | 0 | 1 | 1 | 0 | 1 | 1 | 1 | 1 | 0 | 1 | 0 | 1 | 1 | 1 | 0 | 1 | 1 | 1 | 1 |
| S6 | 1 | 0 | 0 | 1 | 1 | 1 | 0 | 1 | 1 | 1 | 1 | 0 | 1 | 1 | 1 | 1 | 1 | 0 | 0 | 0 | 0 | 1 | 0 | 0 | 1 | 1 | 1 | 0 | 1 | 0 | 0 | 1 |
| S7 | 0 | 0 | 1 | 1 | 0 | 0 | 0 | 1 | 0 | 0 | 0 | 1 | 0 | 1 | 1 | 0 | 1 | 0 | 0 | 1 | 0 | 0 | 0 | 1 | 0 | 0 | 0 | 1 | 0 | 1 | 1 | 0 |
| S8 | 1 | 1 | 1 | 1 | 1 | 1 | 1 | 0 | 1 | 0 | 0 | 1 | 1 | 1 | 0 | 0 | 0 | 1 | 1 | 1 | 1 | 1 | 1 | 1 | 0 | 1 | 1 | 0 | 0 | 1 | 1 | 0 |

FIG. 3C.

SEC-DED-S4ED ECC MATRIX DATA BITS C4:D36

300

| | C4 | M6 | M5 | D63 | D62 | D61 | D60 | D59 | D58 | D57 | D56 | C55 | C50 | D54 | D53 | D52 | D51 | D50 | D49 | D48 | D47 | D46 | D45 | D44 | D43 | D42 | D41 | D40 | D39 | D38 | D37 | D36 |
|---|---|---|---|---|---|---|---|---|---|---|---|---|---|---|---|---|---|---|---|---|---|---|---|---|---|---|---|---|---|---|---|---|
| S0 | 0 | 1 | 0 | 0 | 1 | 0 | 0 | 0 | 1 | 0 | 1 | 0 | 1 | 1 | 1 | 1 | 1 | 1 | 1 | 1 | 1 | 1 | 1 | 1 | 1 | 1 | 1 | 1 | 1 | 1 | 1 | 1 |
| S1 | 0 | 0 | 1 | 0 | 0 | 0 | 0 | 0 | 0 | 1 | 1 | 1 | 1 | 0 | 1 | 1 | 1 | 1 | 0 | 0 | 1 | 0 | 0 | 0 | 0 | 0 | 0 | 0 | 1 | 0 | 0 | 0 |
| S2 | 0 | 0 | 0 | 1 | 0 | 0 | 1 | 0 | 1 | 0 | 0 | 0 | 1 | 1 | 1 | 0 | 0 | 0 | 1 | 1 | 0 | 1 | 0 | 0 | 1 | 0 | 0 | 0 | 0 | 1 | 1 | 1 |
| S3 | 0 | 0 | 0 | 1 | 1 | 1 | 0 | 0 | 0 | 1 | 1 | 1 | 0 | 0 | 1 | 0 | 1 | 0 | 0 | 1 | 0 | 0 | 0 | 1 | 0 | 0 | 1 | 0 | 0 | 0 | 1 | 1 |
| S4 | 1 | 1 | 1 | 0 | 1 | 0 | 0 | 1 | 0 | 0 | 0 | 0 | 1 | 0 | 0 | 0 | 0 | 0 | 1 | 1 | 1 | 0 | 1 | 0 | 0 | 1 | 0 | 0 | 0 | 0 | 0 | 0 |
| S5 | 0 | 0 | 0 | 0 | 0 | 1 | 1 | 0 | 1 | 1 | 0 | 0 | 0 | 0 | 0 | 1 | 0 | 1 | 0 | 1 | 0 | 1 | 1 | 1 | 1 | 0 | 1 | 0 | 0 | 1 | 0 | 0 |
| S6 | 0 | 0 | 1 | 1 | 0 | 1 | 1 | 0 | 0 | 1 | 0 | 0 | 0 | 0 | 0 | 0 | 0 | 0 | 0 | 0 | 0 | 1 | 0 | 1 | 1 | 1 | 0 | 1 | 0 | 0 | 0 | 0 |
| S7 | 0 | 0 | 0 | 0 | 0 | 0 | 0 | 1 | 0 | 0 | 1 | 0 | 0 | 1 | 0 | 0 | 0 | 0 | 1 | 0 | 0 | 0 | 0 | 1 | 0 | 1 | 0 | 1 | 0 | 0 | 0 | 0 |
| S8 | 0 | 1 | 0 | 0 | 0 | 0 | 1 | 0 | 1 | 0 | 1 | 0 | 0 | 1 | 0 | 0 | 0 | 0 | 0 | 1 | 1 | 0 | 0 | 0 | 0 | 0 | 0 | 0 | 1 | 0 | 0 | 1 |

SEC-DED-S4ED ECC MATRIX DATA BITS D35:D0

| | S0 | S1 | S2 | S3 | S4 | S5 | S6 | S7 | S8 |
|---|---|---|---|---|---|---|---|---|---|
| D0  | 1 | 1 | 1 | 0 | 1 | 1 | 1 | 0 | 0 |
| D1  | 1 | 1 | 1 | 0 | 0 | 1 | 1 | 0 | 0 |
| D2  | 1 | 1 | 1 | 1 | 0 | 0 | 1 | 0 | 0 |
| D3  | 1 | 1 | 1 | 1 | 1 | 0 | 0 | 1 | 0 |
| D4  | 1 | 1 | 1 | 1 | 1 | 0 | 0 | 1 | 0 |
| D5  | 1 | 1 | 1 | 1 | 1 | 1 | 0 | 1 | 0 |
| D6  | 1 | 1 | 1 | 1 | 1 | 1 | 0 | 1 | 0 |
| D7  | 1 | 0 | 1 | 1 | 0 | 1 | 0 | 0 | 0 |
| D8  | 1 | 1 | 0 | 0 | 0 | 1 | 1 | 0 | 1 |
| D9  | 1 | 1 | 1 | 0 | 0 | 1 | 1 | 0 | 0 |
| D10 | 1 | 0 | 1 | 1 | 1 | 0 | 0 | 0 | 0 |
| D11 | 1 | 0 | 1 | 1 | 1 | 0 | 0 | 0 | 0 |
| D12 | 0 | 0 | 1 | 1 | 1 | 0 | 0 | 0 | 1 |
| D13 | 0 | 1 | 0 | 0 | 1 | 1 | 0 | 0 | 0 |
| D14 | 0 | 0 | 0 | 1 | 1 | 0 | 0 | 1 | 0 |
| D15 | 0 | 0 | 1 | 0 | 1 | 0 | 0 | 0 | 0 |
| D16 | 0 | 1 | 1 | 1 | 0 | 1 | 0 | 1 | 0 |
| D17 | 0 | 1 | 1 | 1 | 0 | 1 | 0 | 1 | 0 |
| D18 | 0 | 1 | 1 | 0 | 0 | 1 | 0 | 1 | 0 |
| D19 | 0 | 1 | 1 | 0 | 0 | 1 | 1 | 0 | 0 |
| D20 | 0 | 1 | 1 | 0 | 0 | 1 | 1 | 0 | 0 |
| D21 | 0 | 0 | 1 | 1 | 1 | 0 | 0 | 1 | 0 |
| D22 | 0 | 0 | 0 | 0 | 1 | 1 | 0 | 1 | 0 |
| D23 | 0 | 0 | 1 | 1 | 0 | 1 | 0 | 0 | 0 |
| D24 | 0 | 0 | 0 | 0 | 1 | 1 | 0 | 0 | 0 |
| D25 | 0 | 1 | 1 | 0 | 1 | 0 | 0 | 0 | 0 |
| D26 | 1 | 0 | 0 | 0 | 0 | 1 | 1 | 0 | 0 |
| D27 | 1 | 0 | 0 | 0 | 1 | 0 | 0 | 1 | 0 |
| D28 | 1 | 0 | 0 | 0 | 1 | 0 | 0 | 1 | 0 |
| D29 | 0 | 1 | 1 | 1 | 0 | 0 | 0 | 0 | 1 |
| D30 | 1 | 0 | 0 | 0 | 1 | 0 | 0 | 0 | 0 |
| D31 | 1 | 0 | 0 | 1 | 0 | 1 | 0 | 0 | 0 |
| D32 | 1 | 0 | 0 | 0 | 1 | 1 | 0 | 0 | 0 |
| D33 | 1 | 0 | 0 | 0 | 1 | 0 | 0 | 0 | 0 |
| D34 | 1 | 0 | 0 | 1 | 0 | 0 | 0 | 1 | 0 |
| D35 | 1 | 0 | 1 | 0 | 0 | 0 | 0 | 1 | 0 |

FIG. 3D.

SYNDROME TABLE FOR ECC

| S[8:4] \ S[3:0] | 0 | 1 | 2 | 3 | 4 | 5 | 6 | 7 | 8 | 9 | a | b | c | d | e | f |
|---|---|---|---|---|---|---|---|---|---|---|---|---|---|---|---|---|
| 00 | C4 | C0 | C1 | M | C2 | M | M | 47 | C3 | M | M | 53 | M | 41 | 29 | M |
| 01 | C5 | M | M | 50 | M | 38 | 25 | M | M | 33 | 24 | M | 11 | M | M | 16 |
| 02 | M | 40 | 13 | 46 | M | 37 | 19 | M | M | 31 | 32 | M | 7 | M | M | 10 |
| 03 | C6 | M | M | M | 59 | M | M | 66 | M | M | M | 0 | M | 67 | 71 | M |
| 04 | M | 44 | 28 | 43 | M | 36 | 18 | M | M | 49 | 15 | M | 63 | M | M | 6 |
| 05 | M | 26 | 106 | M | 64 | M | 2 | 52 | 68 | M | M | 62 | M | M | M | M |
| 06 | 116 | M | M | 42 | M | 35 | 17 | M | M | 45 | 54 | M | 21 | M | M | M |
| 07 | C7 | M | M | M | 99 | M | M | 3 | M | M | 14 | 20 | M | M | M | 5 |
| 08 | M | 27 | 113 | M | 112 | M | M | 51 | 114 | M | M | M | 73 | M | M | M |
| 09 | M | 23 | M | M | 109 | M | M | 9 | 95 | 48 | M | M | M | M | M | M |
| 0a | 103 | M | 110 | M | M | M | M | M | 108 | M | M | M | M | M | M | M |
| 0b | M | 22 | M | M | M | M | M | M | M | M | M | M | M | M | M | M |
| 0c | M | M | M | M | M | M | M | M | M | M | M | M | M | M | M | M |
| 0d | 102 | M | M | M | M | M | M | M | M | M | M | M | M | M | M | M |
| 0e | 98 | M | M | M | M | M | M | M | M | M | M | M | M | M | M | M |
| 0f | M | M | M | M | M | M | M | M | 56 | M | M | M | M | M | M | M |

FIG. 4A.

SYNDROME TABLE FOR ECC

| S[8:4] | \ S[3:0] | 0 | 1 | 2 | 3 | 4 | 5 | 6 | 7 | 8 | 9 | a | b | c | d | e | f |
|---|---|---|---|---|---|---|---|---|---|---|---|---|---|---|---|---|---|
| 10 | | C8 | M | M | M | M | M | M | M | M | M | M | M | M | M | M | M |
| 11 | | M | M | 100 | 39 | M | 34 | 105 | M | 87 | 30 | 104 | M | 101 | M | M | 4 |
| 12 | | M | 97 | 82 | M | 83 | M | M | 12 | 96 | M | M | 57 | M | M | M | M |
| 13 | | 94 | M | M | M | 78 | M | M | 1 | M | M | 79 | M | 69 | M | M | M |
| 14 | | M | 93 | 92 | M | 91 | M | M | 8 | 90 | M | M | M | M | M | M | M |
| 15 | | 89 | M | M | M | M | M | M | M | M | M | M | M | M | M | M | M |
| 16 | | 86 | M | M | M | M | M | M | M | 60 | M | M | M | M | M | M | M |
| 17 | | M | M | M | M | M | M | M | 55 | 81 | M | M | M | M | M | M | M |
| 18 | | M | 88 | 85 | M | 84 | M | M | M | M | M | M | M | M | M | M | M |
| 19 | | 77 | M | M | M | 65 | 119 | 118 | M | 127 | 126 | M | M | M | M | M | M |
| 1a | | 74 | M | M | M | M | M | M | M | M | M | 76 | M | M | M | M | M |
| 1b | | M | 70 | 107 | M | 75 | M | M | M | 61 | M | M | M | 125 | M | M | M |
| 1c | | 80 | 115 | 124 | M | 121 | M | M | M | 117 | M | M | M | M | M | M | M |
| 1d | | M | 123 | 122 | M | M | M | M | M | M | M | M | M | M | M | M | M |
| 1e | | M | M | M | M | M | M | M | M | M | M | M | M | M | M | M | M |
| 1f | | 111 | M | M | M | M | M | M | M | M | M | M | M | M | M | M | M |

FIG. 4B.

ERROR DETECTION AND CORRECTION CODE FOR DATA AND CHECK CODE FIELDS

BACKGROUND OF THE INVENTION

The present invention relates to error detection and correction, and more specifically to a 9 bit error correcting code (ECC) for correcting single bit errors, detecting double bit errors, and detecting nibble errors in a 144 bit field (135 data bits).

A number of schemes exist for correcting errors and detecting corruption of data during transport, for example, data transmitted between agents over a network or between an external memory and a processor's internal memory cache. One example of a scheme for detecting errors in a data field is parity. When data is transmitted, a parity generator appends an additional parity bit to the data, for example a 9th bit (parity) to a 8-bit byte, such that the overall parity of the 9-bit field is odd or even. The receiving entity checks the parity of the 9-bit field and an error is detected if the parity does not match the predetermined parity (odd or even). This only works well for detecting single bit errors in a word.

Another example of an error detection scheme is a CRC (cyclic redundancy check) checksum. When receiving a data field for the first time, a CRC generator divides the data bits by a generator polynomial $G(x)$. The remainder of the division is the CRC checksum, which is written in two bytes and appended to the data. When the bit field is retrieved another time, the complete sequence of bits, including the CRC bits, will be read by a CRC checker. The complete sequence should be exactly divisible by the generator polynomial $G(x)$. If they are not, an error has been detected. One example of a standard generator polynomial is $G(x)=x^{16}+x^{12}+x^5+1$ which has the binary value 10001000000100001. This value has been defined by the CCITT and is often called CRC-CCITT. Implemented in hardware, the CRC check is an exclusive OR (XOR) of each bit position.

Closely related to the CRC are ECC codes (error correcting or error checking and correcting). ECC codes are sometimes referred to as EDC codes for error detecting and correcting. ECC codes are in principle CRC codes whose redundancy is so extensive that they can restore the original data if an error occurs that is not too disastrous. ECC codes are used, for example, for magnetic data recording with floppy or hard disk drives as well as for fail-safe RAM memory systems. A memory controller with embedded ECC logic, for example, is able to repair soft errors in DRAM chips caused by natural radioactivity in the air or tiny amounts of radioactive substances in the chip substrate. The ionizing effect of alpha-particles causes additional charges in the storage area of a DRAM memory cell which may distort the held value.

FIG. 1 depicts an example of a memory system 10 using embedded ECC logic (or CRC logic) for error detection and correction. Memory system 10 incudes bus interface 20, memory 25 and memory controller 30. Memory 25 is any memory device such as a floppy or a hard drive, for example. Memory system 10 is useful for transferring data between memory 25 and main memory or RAM (not shown), which is usually one or more banks of DRAM chips, for example. Data is transferred through controller 30 to and from bus interface 20 and controller chip 35. Bus interface 20 provides the connection to the main memory. Controller chip 35 determines the ECC (or CRC) bytes and provides any necessary formatting such as converting parallel submitted data into serial data and vice versa. ECC logic 40 (or CRC) generates and/or checks ECC bytes (or CRC bytes) being transmitted between bus interface 20 and memory 25. If an error is detected ECC (CRC) logic 40 generates an error detect signal to controller 35, and if the error is correctable, ECC logic 40 handles correction. Microprocessor 50 provides overall control, including synchronization, of controller chip 35 ECC (CRC) logic 40 and memory interface 60 of memory controller 30. Microcode ROM 55 provides the necessary instructions for microprocessor 50, and memory interface 60 provides the necessary interface to memory 25, depending on the memory type.

Conventional and modified Hamming SEC-DED codes (single error correction, double error detection codes) have been widely used to increase computer memory reliability. These codes generally require a large number of check bits and often require extensive circuitry to handle a complicated and lengthy decoding process. An improvement to the conventional Hamming SEC-DED codes that provides faster and better error-detection algorithm is given in Hsiao, M. Y., "A Class of Optimal Minimum Odd-weight-column SEC-DED Codes", IBM Journal of Research and Development, Vol.14, No. 4, July 1980, which is hereby incorporated by reference. The Hsiao algorithm demonstrates a new way of constructing a class of SEC-DED codes that use the same number of check bits as the Hamming SEC-DED code but which is superior in cost, performance and reliability.

What is needed in the art is an algorithm for detecting and correcting single bit errors, detecting double bit errors, and detecting multiple bit errors within a nibble for 135 data bits and 9 check bits.

SUMMARY OF THE INVENTION

The present invention provides a method and apparatus for detecting and correcting single bit errors, detecting double bit errors, and detecting multiple bit errors within a nibble of a data field comprising 135 data bits and 9 check bits.

According to an aspect of the invention a method of detecting errors in data is provided, comprising the steps of: a) generating a 9-bit check field for a 135-bit data field; b) appending the check field to said data field so as to create a 144-bit cumulative data field; c) transporting the cumulative data field to an agent; d) generating a 9-bit syndrome (S[8:0]) for detecting errors using the cumulative data field; and e) determining, based on the syndrome, whether the cumulative data field includes an error.

According to another aspect of the invention, a system for detecting errors in data is provided, the system comprising: a check field generator for generating a 9-bit check field for a 135-bit data field, wherein the check field is appended to the data field so as to create a 144-bit cumulative data field; a transport mechanism for transporting the cumulative data field to an agent; and an error detection circuit, coupled to the agent, for detecting errors in the cumulative data field, wherein the circuit generates a 9-bit error detection syndrome (S[8:0]) using the cumulative data field and wherein the circuit determines, based on the syndrome, whether the cumulative data field includes an error.

The invention will be further understood upon review of the following detailed description in conjunction with the drawings.

BRIEF DESCRIPTION OF THE DRAWINGS

Figure 3A:
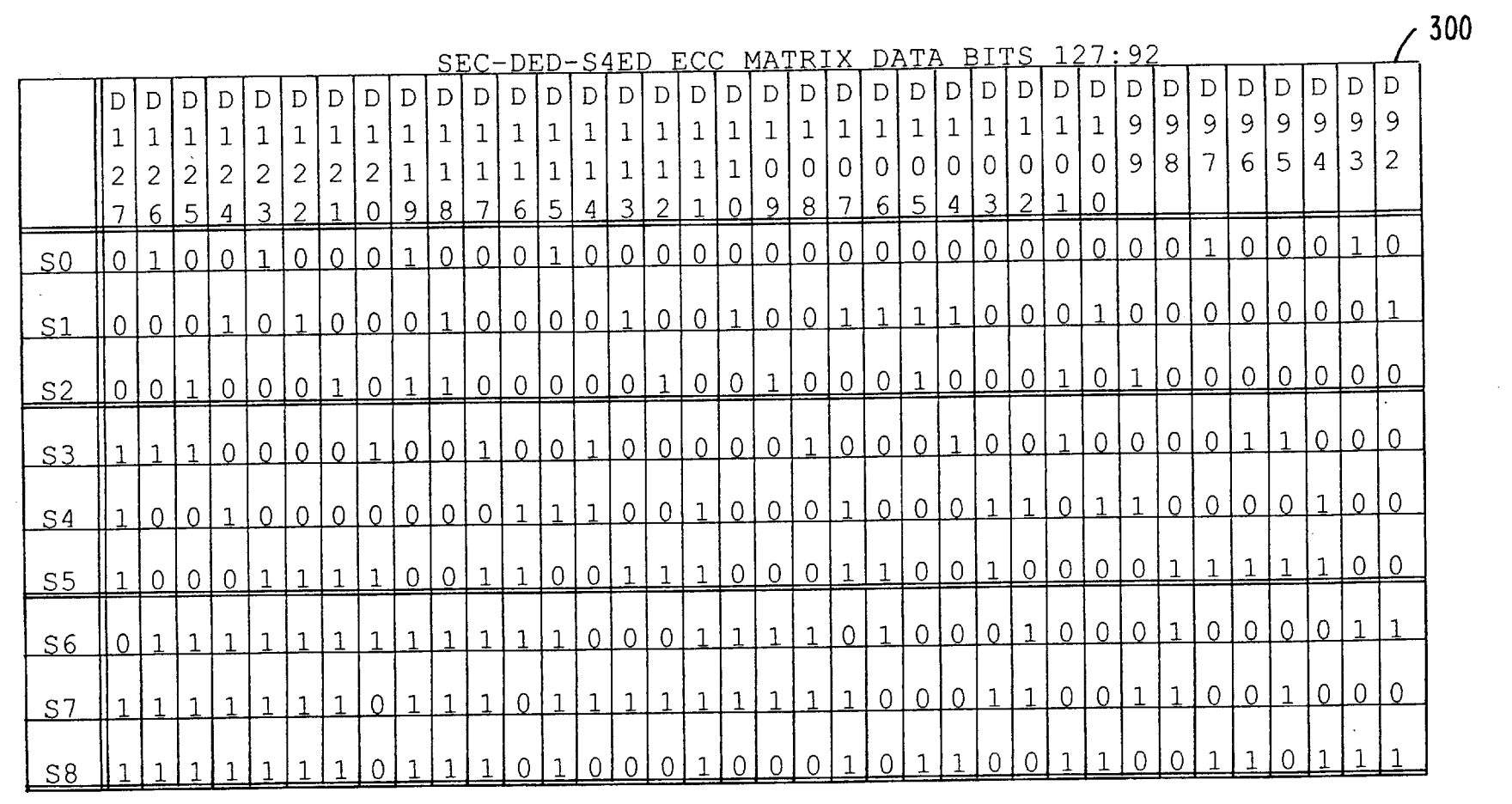

FIGS. 3a–d shows an ECC code matrix according to an embodiment of the present invention; and FIG. 4 depicts a table representing the error indication for a given generated syndrome according to an embodiment of the present invention.

DESCRIPTION OF THE PREFERRED EMBODIMENT

Figure 1:
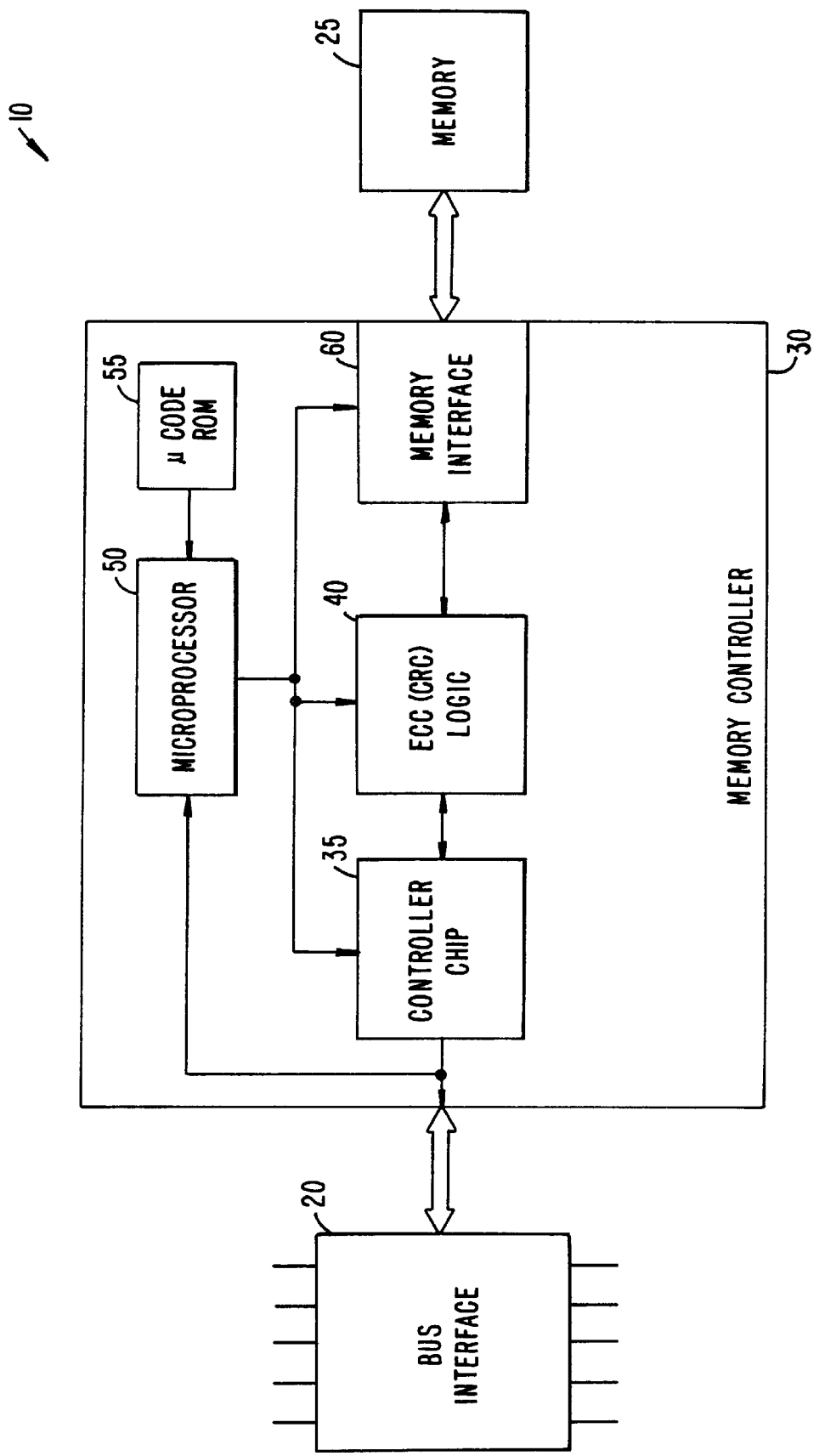
FIG. 1 depicts an example of a memory system using embedded ECC logic (or CRC logic)
Figure 2:
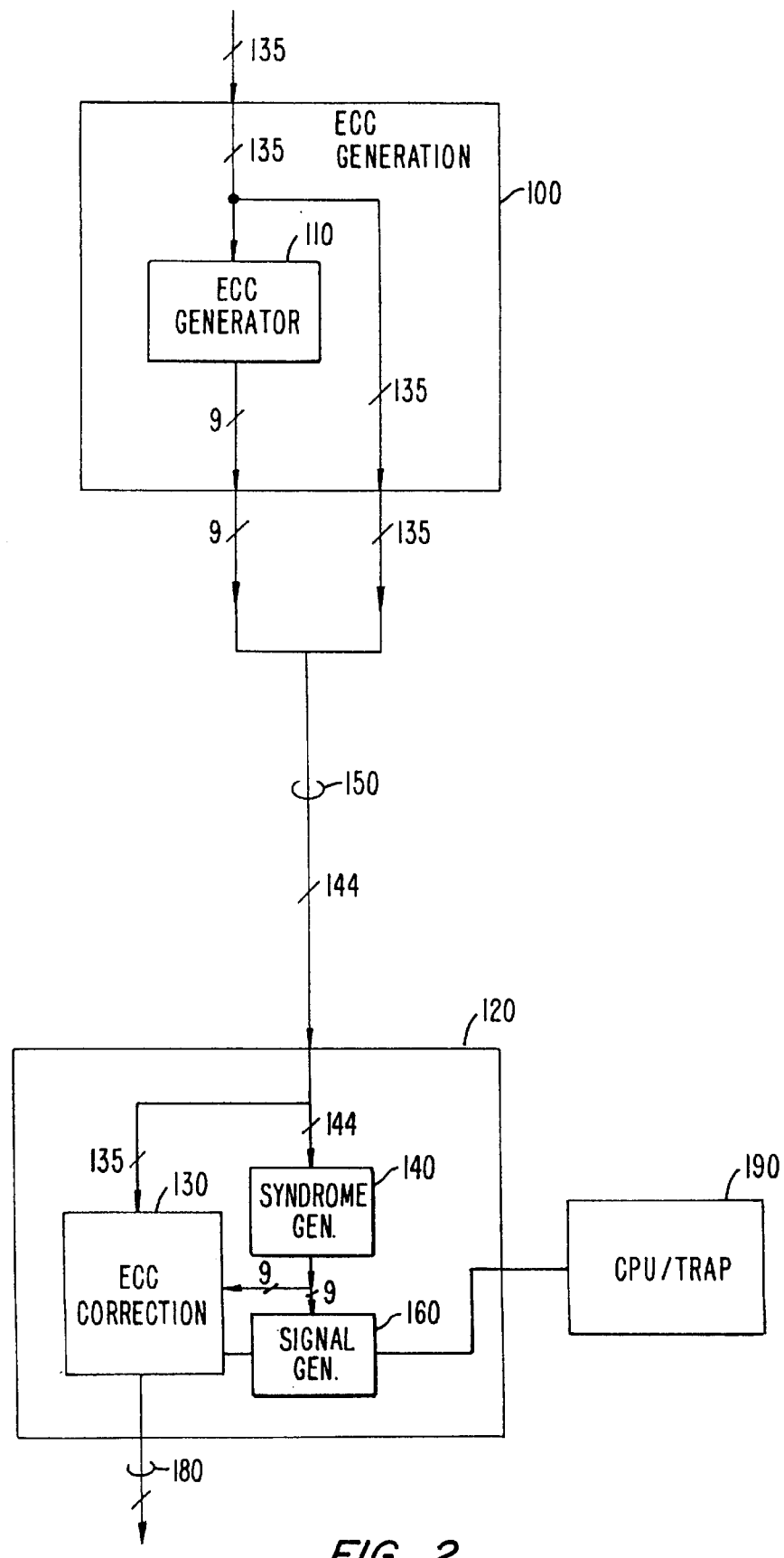
FIG. 2 is a simplified block diagram of an ECC system according to an embodiment of the present invention.

FIG. 2 is a simplified block diagram of an ECC system according to an embodiment of the present invention. ECC generation circuit 100 includes ECC generator 110. ECC generation circuit 100 is coupled to ECC detection and correction circuit 120 by bus 150. ECC detection and correction circuit 120 includes ECC correction logic 130 and ECC checking logic (syndrome generator 140 and signal generator 160). ECC generation circuit 100 and ECC detection and correction circuit 120 can be included on the same chip, such as on a CPU chip, or they can exist as separate components.

ECC generation circuit 100 receives a data field and inputs the data field to ECC generator 110. ECC generator processes the data field and generates check bits according to the methodology as will be described below. The check bits are concatenated with, or appended to, the original data field on bus 150.

According to an embodiment of the present invention, the incoming data field comprises 135 data bits. ECC generator 110, in this embodiment, generates 9 check bits, which are concatenated with the 135-bit data field to make up a 144-bit cumulative data field.

ECC detection and correction circuit 120 receives the cumulative data field over bus 150. The cumulative data field is provided to syndrome generator 140 and the 135-bit data field is provided to ECC correction logic 130. As shown, ECC correction logic 130 and syndrome generator 140 and signal generator 160 are separate circuit components, but they may be implemented as one functional circuit element.

Syndrome generator 140 processes the received cumulative data and generates an error detection syndrome according to the methodology of the present invention as will be described below. The 9-bit syndrome is received by ECC correction logic circuit 130 and signal generator 160. Signal generator 160 reads the syndrome and generates an error signal if the syndrome indicates an error in the cumulative data field (135-bit data field+9-bit ECC check field). If the error is correctable, signal generator 160 generates a signal indicating that an error was detected and that it is correctable. As shown, syndrome generator 140 and signal generator 160 are separate circuit components, but they may be implemented as one functional circuit element.

ECC correction logic circuit 130 corrects any correctable errors in the data field. In one embodiment, ECC correction circuit 130 is provided with a connection to signal generator 160 so as to receive error detection signals. If no error is present, the data field passes through correction circuit 130 as output over bus 180. If an error exists and is correctable, correction circuit 130 corrects the error and outputs the corrected data field on bus 180.

ECC detection and correction circuit 120 is also coupled to control circuit 190. In one embodiment, control circuit 190 is a CPU trap generator for generating and executing a software trap. For example, if an error is detected, the error is logged to control circuit 190. If the error is correctable, the error is logged as a correctable error. If the error is not correctable, the error is logged as uncorrectable. In this case, a software trap is generated to kill any processing of the errored data and to control reloading or restoring a clean copy of the data from a main memory, for example. Copending application Ser. No. 08/880,369 (our file 16747-7200), filed Jun. 23, 1997, which is hereby incorporated by reference, shows one example of a CPU that includes a data transport/cache system with a software trap for which the present invention is useful.

In operation, the data field (135-bit) is received by ECC generator 110. The 9 check bits are generated by exclusive or'ing (XOR) all the bits marked with a '1' in each row, excluding the check bit columns (i.e., just the 135 data bits). According to an embodiment of the present invention, the check bits are generated according to the ECC code matrix 200 shown in FIGS. 3a–d. That is, the XORing of the data bits is done according to the order of bits listed in ECC code matrix 300. In matrix 300, D[127:0] designate the 128 data bits, M[6:0] designate the 7 MTag bits (which are set to zero when generating ECC bits and when checking for errors), C[8:0] designate the 9 ECC check bits, and S[8:0] designate the syndrome bits generated from the data, MTag and ECC check bits (cumulative data field). Alternatively, the MTag bits are 35 replaced with data bits such that matrix 300 represents 135 data bits D[134:0], 9 ECC check bits C[8:0], and 9 syndrome bits S[8:0].

ECC code matrix 300 is implemented in circuitry using RTL and is designed according to the following properties:

1) all columns have odd weight (an Odd weight column);
2) all possible one-weight columns (9) are used for check bits;
3) all possible three-weight columns (84) are used;
4) 51 of the possible 126 five-weight columns are used; and
5) the matrix is mirrored except for the two nibbles in the middle (i.e., bit positions [143:76] are a rotation of bit positions [0:67]). In other words, column 143 is the flipped image of column 0, column 142 is the flipped image of column 1, etc. . . . Column 143 corresponds to data bit 127 (D127) and column 0 corresponds to data bit 0 (D0).

Once the check bits have been generated by ECC generator 110, they are then stored with, or concatenated with, the data field resulting in the 144-bit cumulative data field on bus 150. Syndrome generator 140 of ECC detection and correction circuit 120 receives the cumulative data and generates a 9-bit error detection syndrome. Like the ECC bits, the syndrome bits are generated according to the ECC code matrix 200 shown in FIGS. 3a–d. That is, the cumulative data field is XORed according to the order of bits listed in ECC code matrix 300 to produce the 9-bit syndrome. If the weight of the syndrome is zero (i.e., all syndrome bits are zero), then no error has occurred in the cumulative data field. If the weight of the syndrome is greater than zero (i.e., one through nine) then an error has occurred. "Weight" is defined as the number of "1"s in a column. Whether the error is correctable or not depends on the weight and/or patterns as follows:

1) A zero weight syndrome means there is no error;
2) A correctable single bit error is indicated by the following:

Any 1- or 3-weight syndromes.

Any 5-weight syndromes following one of these patterns i) S[2:0]=3'b111 OR
ii) S[5:3]=3'b111 OR
iii) S[8:6]=3'b111 OR
iv) S[5:3]=3'b011 AND S[2:0]=3'b011 OR
v) S[8:6]=3'b110 AND S[5:3]=3'b110

3) Detection of 3-bit errors within a nibble:

Modulo 2 addition of any combination of 3 syndromes within a nibble (0-1-2, 0-1-3, 0-2-3, 1-2-3) yield either a 7-weight syndrome or a 5-weight syndrome which does not match any correctable 5-weight syndromes in the matrix.

4) Detection of 4-bit errors within a nibble: Modulo 2 addition of all 4 syndromes within the nibble result in a 6-weight syndrome.

A nibble, is defined to be a grouping of four consecutive data bits from left to right for each matrix. In other words, D[127:124] correspond to columns 0 to 3 of the first nibble, D[123:120] corresponds to columns 0 to 3 of the second nibble and so on. There are a total of 38 nibbles and D[3:0] is the last nibble.

5) Multiple bit error is detected by any even weight syndrome or a 7- or 9-weight syndrome or a 5-weight syndrome that doesn't satisfy the above correctable patterns.

For example, if the syndrome listed in column D66 of matrix 300 (FIG. 3b) is generated, a five-weight error with S[2:0]=3'b111 has occurred. This represents that a single bit correctable error has occurred in data bit 66. Similarly, if the syndrome listed in column D57 is generated, then a five-weight correctable single bit error of the type S[5:3]=3'b011 AND S[2:0]=3'b011 has occurred.

FIG. 4 depicts a table 400 representing the error indication for a given generated syndrome according to an embodiment of the present invention. M indicates a multi-bit uncorrectable error, an integer indicates the data bit number (correctable), and C0 through C8 indicates a check bit number (correctable). For example, suppose a single bit error in data bit D81 has occurred. Syndrome generator 160 will generate a syndrome according column D81 of FIG. 3. S[3:0] of column D81 represents the value 8, and S[8:4] represents the value 18. Thus, checking column 8 and row 18 of table 400 indicates that a single bit error has occurred at D81. Supposing a different syndrome is generated with the values S[3:0]=5 and S[8:4]=1d, referencing table 400 at column 5, row 1d indicates that a multi-bit error has occurred.

The invention has now been explained with reference to specific embodiments. Other embodiments will be apparent to those of ordinary skill in the art upon reference to the present description. It is therefore not intended that this invention be limited, except as indicated by the appended claims.

What is claimed is:

1. A method of detecting errors in data, comprising the steps of:
   a) generating a 9-bit check field for a 135-bit data field;
   b) appending said check field to said data field so as to create a 144-bit cumulative data field;
   c) transporting said cumulative data field to an agent;
   d) generating a 9-bit syndrome (S[8:0]) for detecting errors using said cumulative data field; and
   e) determining, based on said syndrome, whether said cumulative data field includes an error.

2. The method of claim 1, wherein said step e) of determining includes the step of determining a weight of said syndrome, wherein said cumulative bit field includes an error if said weight is greater than zero.

3. The method of claim 2, further including the step of generating an error signal indicating that a correctable single bit error has been detected in said cumulative data field if said syndrome is one of a one-weight syndrome and a three-weight syndrome.

4. The method of claim 2, further including the step of generating an error signal indicating that a three bit error has been detected in a nibble of said cumulative data field if said syndrome is one of a seven-weight syndrome and a five weight-syndrome that does not indicate a correctable error.

5. The method of claim 2, further including the step of generating an error signal indicating that a four bit error has been detected in a nibble of said cumulative data field if said syndrome is a six-weight syndrome.

6. The method of claim 2, further including the step of generating an error signal indicating that a multiple bit error has been detected in said cumulative data field if said syndrome is one of an even-weight syndrome, a seven-weight syndrome, a nine-weight syndrome, and a five weight-syndrome that does not indicate a correctable error.

7. The method of claim 1, wherein said 135-bit data field includes 7 MTag bits, and wherein said MTag bits are treated as zero during said generating steps a) and d).

8. A system for detecting errors in data, comprising:
   a check field generator for generating a 9-bit check field for a 135-bit data field, wherein said check field is appended to said data field so as to create a 144-bit cumulative data field;
   a transport mechanism for transporting said cumulative data field to an agent;
   an error detection circuit, coupled to said agent, for detecting errors in said cumulative data field, wherein said circuit generates a 9-bit error detection syndrome (S[8:0]) using said cumulative data field and wherein said circuit determines, based on said syndrome, whether said cumulative data field includes an error.

9. The system of claim 8, wherein said circuit determines a weight of said syndrome, and wherein said circuit generates an error signal if said weight is greater than zero.

10. The system of claim 9, wherein said circuit generates an error signal indicating that a correctable single bit error has been detected in said cumulative data field if said syndrome is one of a one-weight syndrome and a three-weight syndrome.

11. The system of claim 9, wherein said circuit generates an error signal indicating that a three-bit error has been detected in a nibble of said cumulative data field if said syndrome is one of a seven-weight syndrome and a five weight-syndrome that does not indicate a correctable error.

12. The system of claim 9, wherein said circuit generates an error signal indicating that a four-bit error has been detected in a nibble of said cumulative data field if said syndrome is a six-weight syndrome.

13. The system of claim 9, wherein said circuit generates an error signal indicating that a multiple-bit error has been detected in said cumulative data field if said syndrome is one of an even-weight syndrome, a seven-weight syndrome, a nine-weight syndrome, and a five weight-syndrome that does not indicate a correctable error.

14. The system of claim 8, wherein said 135-bit data field includes 7 MTag bits, and wherein said MTag bits are treated as zero by said check field generator and said circuit.

15. A method of detecting errors in data, comprising the steps of:
   a) generating a 9-bit check field for a 135-bit data field;
   b) appending said check field to said data field so as to create a 144-bit cumulative data field;

c) transporting said cumulative data field to an agent;

d) generating a 9-bit syndrome (S[8:0]) for detecting errors using said cumulative data field;

e) determining, based on said syndrome, whether said cumulative data field includes an error, by determining a weight of said syndrome, wherein said cumulative bit field includes an error if said weight is greater than zero; and f) generating an error signal indicating that a correctable single bit error has been detected in said cumulative data field if said syndrome is a five-weight syndrome and if one of S[2:0], S[5:3] and S[8:6] is three-weight.

16. A method of detecting errors in data, comprising the steps of:

a) generating a 9-bit check field for a 135-bit data field;

b) appending said check field to said data field so as to create a 144-bit cumulative data field;

c) transporting said cumulative data field to an agent;

d) generating a 9-bit syndrome (S[8:0]) for detecting errors using said cumulative data field;

e) determining, based on said syndrome, whether said cumulative data field includes an error, by determining a weight of said syndrome, wherein said cumulative bit field includes an error if said weight is greater than zero; and f) generating an error signal indicating that a correctable single bit error has been detected in said cumulative data field if said syndrome is a five-weight syndrome with both S[2:0] equal to '011' and S[5:3] equal to '011'.

17. A method of detecting errors in data, comprising the steps of:

a) generating a 9-bit check field for a 135-bit data field;

b) appending said check field to said data field so as to create a 144-bit cumulative data field;

c) transporting said cumulative data field to an agent;

d) generating a 9-bit syndrome (S[8:0]) for detecting errors using said cumulative data field;

e) determining, based on said syndrome, whether said cumulative data field includes an error, by determining a weight of said syndrome, wherein said cumulative bit field includes an error if said weight is greater than zero; and f) generating an error signal indicating that a correctable single bit error has been detected in said cumulative data field if said syndrome is a five-weight syndrome with both S[8:6] equal to '110' and S[5:3] equal to '110'.

18. A system for detecting errors in data, comprising:

a check field generator for generating a 9-bit check field for a 135-bit data field, wherein said check field is appended to said data field so as to create a 144-bit cumulative data field;

a transport mechanism for transporting said cumulative data field to an agent;

an error detection circuit, coupled to said agent, for detecting errors in said cumulative data field, wherein said circuit generates a 9-bit error detection syndrome (S[8:0]) using said cumulative data field, wherein said circuit determines, based on said syndrome, whether said cumulative data field includes an error, wherein said circuit determines a weight of said syndrome, wherein said circuit generates an error signal if said weight is greater than zero, and wherein said error signal indicates that a correctable single bit error has been detected in said cumulative data field if said syndrome is a five-weight syndrome and if one of S[2:0], S[5:3] and S[8:6] is three-weight.

19. A system for detecting errors in data, comprising:

a check field generator for generating a 9-bit check field for a 135-bit data field, wherein said check field is appended to said data field so as to create a 144-bit cumulative data field;

a transport mechanism for transporting said cumulative data field to an agent;

an error detection circuit, coupled to said agent, for detecting errors in said cumulative data field, wherein said circuit generates a 9-bit error detection syndrome (S[8:0]) using said cumulative data field, wherein said circuit determines, based on said syndrome, whether said cumulative data field includes an error, wherein said circuit determines a weight of said syndrome, wherein said circuit generates an error signal if said weight is greater than zero, and wherein said error signal indicates that a correctable single bit error has been detected in said cumulative data field if said syndrome is a five-weight syndrome with both S[2:0] equal to '011' and S[5:3] equal to '011'.

20. A system for detecting errors in data, comprising:

a check field generator for generating a 9-bit check field for a 135-bit data field, wherein said check field is appended to said data field so as to create a 144-bit cumulative data field;

a transport mechanism for transporting said cumulative data field to an agent;

an error detection circuit, coupled to said agent, for detecting errors in said cumulative data field, wherein said circuit generates a 9-bit error detection syndrome (S[8:0]) using said cumulative data field, wherein said circuit determines, based on said syndrome, whether said cumulative data field includes an error, wherein said circuit determines a weight of said syndrome, wherein said circuit generates an error signal if said weight is greater than zero, and wherein said error signal indicates that a correctable single bit error has been detected in said cumulative data field if said syndrome is a five-weight syndrome with both S[8:6] equal to '110' and S[5:3] equal to '110'.

* * * * *